United States Patent

Mahabadi et al.

Patent Number: 5,113,156
Date of Patent: May 12, 1992

[54] LOW POWER CRYSTAL OSCILLATOR WITH AUTOMATIC GAIN CONTROL

[75] Inventors: John K. Mahabadi, Tempe, Ariz.; Kenneth R. Burch, Austin, Tex.

[73] Assignee: Motorola, Inc., Schaumburg, Ill.

[21] Appl. No.: 688,729

[22] Filed: Apr. 22, 1991

[51] Int. Cl.$^5$ .......................... H03B 5/36; H03L 1/00
[52] U.S. Cl. ..................... 331/109; 331/75; 331/116 FE; 331/158; 331/183
[58] Field of Search ............. 331/109, 116 FE, 116 R, 331/158, 183, 75

[56] References Cited

U.S. PATENT DOCUMENTS

| | | | |
|---|---|---|---|
| 3,725,822 | 4/1973 | Eaton, Jr. | 331/116 FE |
| 3,935,546 | 1/1976 | Morozumi et al. | 331/116 FE |
| 4,128,816 | 12/1978 | Shimotsuma | 331/116 FE |

FOREIGN PATENT DOCUMENTS 52-10054  1/1977  Japan ........................... 331/116 FE Primary Examiner—Siegfried H. Grimm
Attorney, Agent, or Firm—Robert D. Atkins

[57] ABSTRACT

A crystal oscillator uses automatic gain control to minimize the operating current through its inverting amplifier. The power supply potential to switching transistors of the amplifier is reduced by the automatic gain control to a level substantially equal to the sum of the switching thresholds thereof which minimizes simultaneous conduction through the switching transistors and associated operating current. The low level output signal of the amplifier becomes sinusoidal about a DC bias point operating at the resonant frequency of the crystal which eliminates undesirable harmonicas interfering with the crystal's natural vibration. The sinusoidal output signal may be buffered and level-shifted to a useable state.

10 Claims, 2 Drawing Sheets

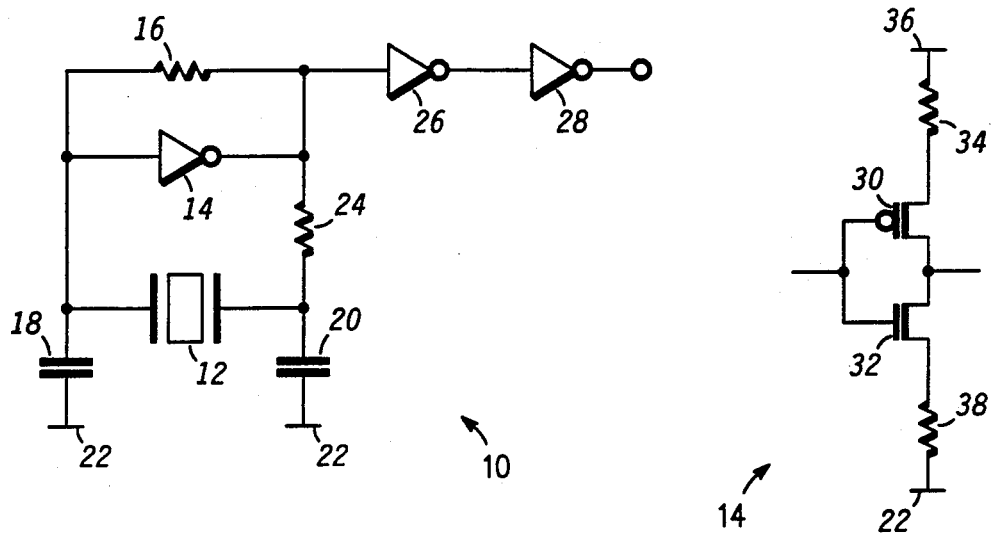
FIG. 1
-PRIOR ART-
FIG. 2
-PRIOR ART-
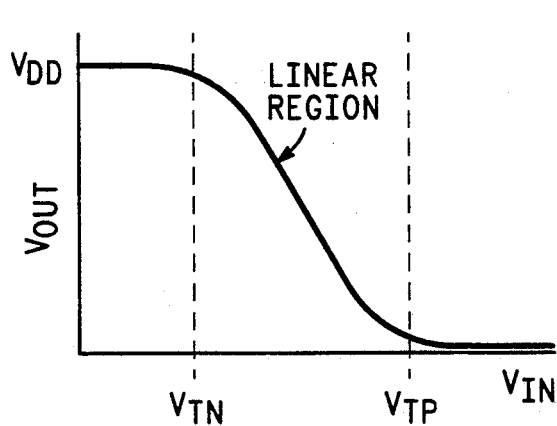
FIG. 3
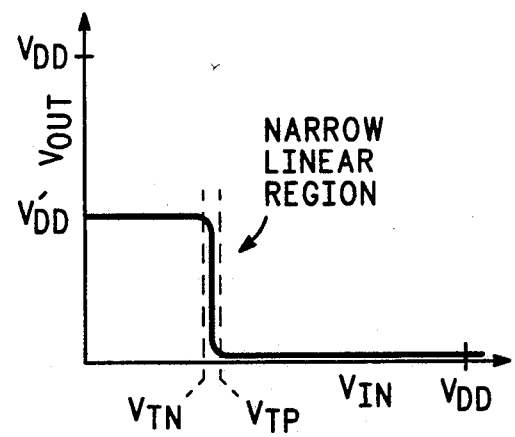
FIG. 5

LOW POWER CRYSTAL OSCILLATOR WITH AUTOMATIC GAIN CONTROL

FIELD OF THE INVENTION

This invention relates in general to crystal oscillators and, more particularly, to a low power crystal oscillator with automatic gain control.

BACKGROUND OF THE INVENTION

Crystal oscillators find many applications in systems requiring a fixed frequency oscillating signal. The Pierce oscillator as described, for example, in U.S. Pat. Nos. 3,725,822 and 3,935,546 and hereinafter in the detailed description of the prior art section is a common variety of CMOS crystal controlled oscillator. The Pierce oscillator includes a quartz crystal operating in parallel with an inverting amplifier which oscillates at the resonant frequency of the crystal. One noted problem with the conventional Pierce oscillator is the high operating current drawn through the inverting amplifier which increases exponentially with the power supply voltage. Reducing power consumption is an important criteria especially in battery driven applications such as wristwatches. Furthermore, the quartz crystal should be excited with a mono-frequency signal operating at its resonant frequency. Unfortunately, the Pierce oscillator generates a square output waveform containing multiple harmonics of the fundamental frequency which may interfere with the crystal's inherent resonant vibrating rhythm.

Hence, what is needed is an improved crystal oscillator having reduced operating current and producing a mono-frequency output signal at the fundamental frequency of the quartz crystal.

SUMMARY OF THE INVENTION

Briefly stated, the present invention comprises an oscillator circuit having first and second terminals for connecting to a crystal for providing an output signal. The oscillator circuit includes an amplifier coupled for receiving first and second sources of operating potential and having an output coupled to the first terminal of the crystal and an input coupled to the second terminal of the crystal for providing the output signal of the oscillator circuit. A feedback circuit is coupled between the input and output of the amplifier for biasing the amplifier, and an automatic gain control circuit is coupled between the first source of operating potential and the amplifier for reducing the average operating current thereof by lowering the level of the first source of operating potential applied to the amplifier to a value substantially equal to the sum of an upper threshold plus a lower threshold of the amplifier.

Thus, one advantage of the present invention is the technique of using automatic gain control to reduce the operating potential of the inverting amplifier for producing a low level, sinusoidal output signal operating about a DC bias point at the resonant frequency of the crystal which eliminates undesirable harmonics interfering with the crystal's natural vibration. The operating potential is reduced by the automatic gain control to a level substantially equal to the sum of the threshold potentials of the switching transistors of the inverting amplifier which minimizes the period of simultaneous conduction through the switching transistors and reduces the average operating current.

BRIEF DESCRIPTION OF THE DRAWINGS

FIG. 1 is a schematic diagram illustrating a conventional Pierce crystal oscillator;

FIG. 2 is a schematic diagram illustrating a conventional inverting amplifier for use in FIG. 1;

FIG. 3 is a graph illustrating the linear region of operation for the conventional inverting amplifier;

FIG. 5 is a graph illustrating the narrow region of operation for the inverting amplifier of FIG. 4.

DETAILED DESCRIPTION OF THE PRIOR ART

Figure 4:
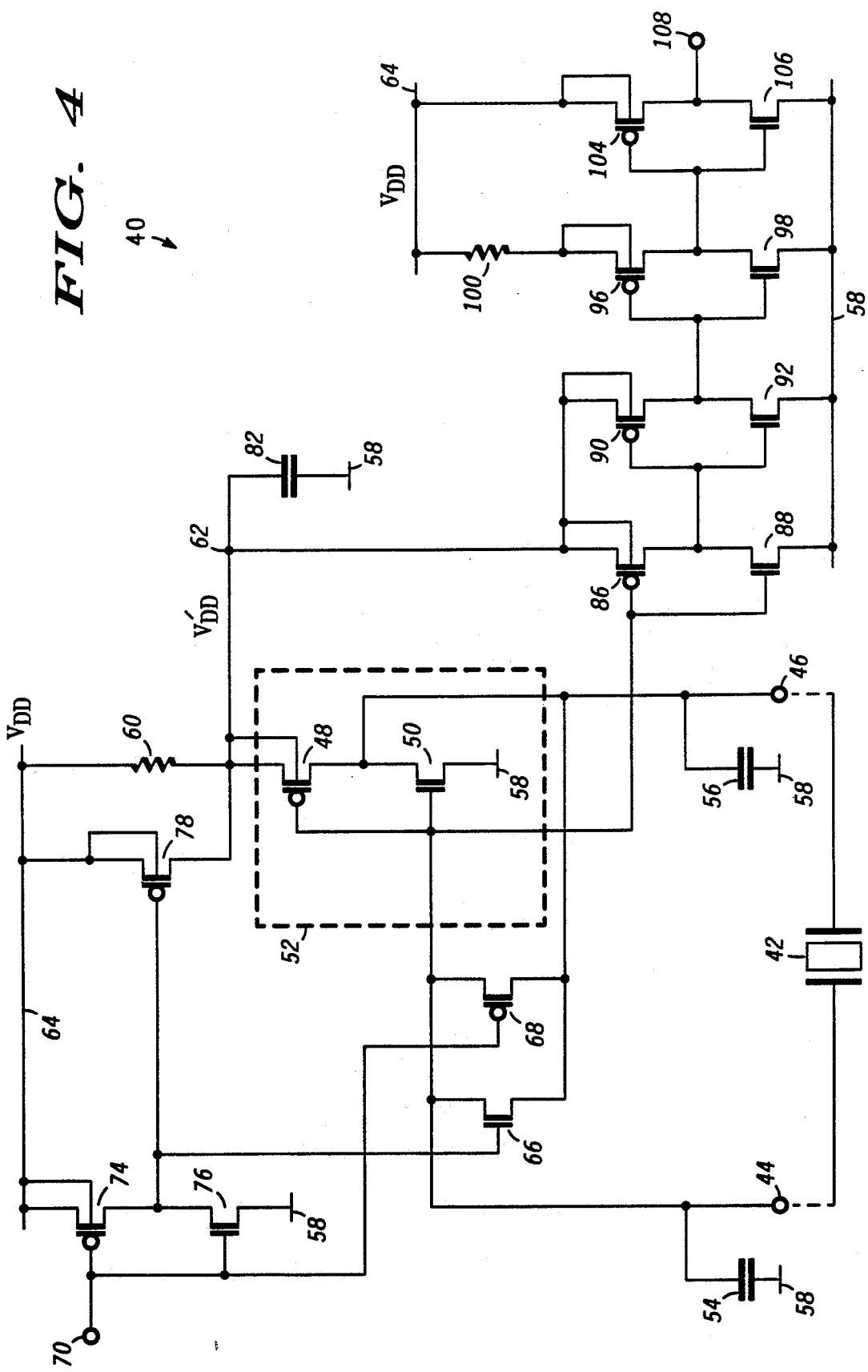
FIG. 4 is a schematic diagram illustrating an improved crystal oscillator.

A conventional Pierce-type crystal oscillator 10 is shown in FIG. 1 including piezoelectric quartz crystal 12 coupled across inverting amplifier 14. A large value resistor 16 is coupled in parallel with amplifier 14 with capacitors 18 and 20 respectively coupled between opposite terminals of crystal 12 and power supply conductor 22 operating at circuit ground potential. Resistor 24 may be coupled between the output of amplifier 14 and capacitor 20 as shown to limit the current fed back through crystal 12. The output signal of crystal oscillator 10 is a square wave at the output of amplifier 14 which is buffered through inverters 26 and 28. One known implementation of inverting amplifier 14 is shown in FIG. 2 including transistors 30 and 32 connected as an inverter. Resistor 34 is coupled between power supply conductor 36 and the source of transistor 30, while resistor 38 is coupled between the source of transistor 32 and power supply conductor 22. Power supply conductor 36 typically operates at 5 volts DC from a battery supply. In the prior art, resistors 34 and 38 are typically selected of equal value for current limiting while maintaining the threshold of amplifier transistors 30-32 at approximately $V_{DD}/2$.

Depending on the application, crystal oscillator 10 may have several problem areas of concern for the circuit designer. For example, transistors 30 and 32 of inverting amplifier 14 are biased in the middle of the $V_{DD}$ supply voltage by feedback resistor 16. Consequently, transistors 30 and 32 each spend an appreciable amount of time operating in their linear regions as they switch between $V_{TN}$ (voltage threshold for transistor 32) and $V_{TP}$ (voltage threshold for transistor 30) as illustrated in the graph of FIG. 3. The voltage $V_{IN}$ is the input voltage of inverting amplifier 14 and $V_{OUT}$ is the output voltage of the same. With both transistors 30 and 32 partially conducting in the linear region, amplifier 14 tends to draw a high operating current. Such a high operating current reduces the life expectancy of the battery supplying oscillator circuit 10. Although resistors 34 and 38 limit the current flowing through amplifier 14, transistors 30 and 32 are still biased at $V_{DD}/2$ and conduct simultaneously during switching.

Another potential problem with oscillator circuit 10 is the square output waveform at the output of amplifier 14. Such a waveform includes multiple harmonics of the fundamental frequency which are undesirable for the crystal load. Ideally, only the fundamental resonant frequency of piezoelectric crystal 12 should be fed back to maintain the excitation. The harmonic components tend to waste energy and detract from the resonant vibration of the crystal.

Hence, it is desirable to reduce the operating current of the inverting amplifier to minimize the power drain in battery applications. Furthermore, it is desirable to generate a monofrequency output signal at the resonant frequency of the crystal to match its inherent oscillation characteristics.

DETAILED DESCRIPTION OF THE PREFERRED EMBODIMENT

Crystal oscillator circuit 40 in accordance with the present invention is shown in FIG. 4 suitable for manufacturing as an integrated circuit using conventional integrated circuit processes. Piezoelectric quartz crystal 42 is coupled across terminals 44 and 46 of the integrated portion of crystal oscillator 40. Crystal 42 is typically the only external component of the integrated embodiment. Terminal 44 is coupled to the gates of transistors 48 and 50 forming inverting amplifier 52 with an output at the common drains thereof coupled back to terminal 46. Other embodiments for amplifier 52 may include a NAND gate or a NOR gate instead of a simple inverter for providing a disable option. Capacitors 54 and 56 are respectively coupled between terminals 44 and 46 and power supply conductor 58 operating at ground potential. Crystal oscillator circuit 40 also includes resistor 60 coupled between the source of transistor 48 at node 62 and power supply conductor 64 operating at a positive potential such as $V_{DD}$, while the source of transistor 50 is directly connected to power supply conductor 58. Resistor 60 provides automatic gain control for maintaining the potential developed at node 62, $V_{DD'}$, at the sum of the switching thresholds of transistors 48 and 50. The large value of resistor 60 and the direct connection of the source of transistor 50 to ground potential is a key feature of the present invention providing amplifier 52 with the reduced operating potential $V_{DD'}$. Resistor 60 may be replaced with an active transistor operating as a current source. The output of amplifier 52 is coupled through the parallel combination of transistors 66 and 68 at the common gates of transistors 48 and 50. Transistors 66 and 68 operate as a transmission gate for providing a predetermined feedback resistance between the input and output of amplifier 52 for biasing its operating threshold. The effective resistance values for transmission gate transistors 66–68 range from 1 mega-ohm for low impedance crystals to 100 mega-ohms for low frequency, high impedance crystals. A typical value for the drain-source resistance of transistors 66 and 68 is 20 megaohms. It is understood that transistors 66 and 68 may be replaced with a fixed value resistor.

An enable signal for crystal oscillator circuit 40 is applied at input 70 at the gates of transistors 74 and 76. Input 70 is also coupled to the gate of transistor 68. The sources of transistors 74 and 76 are coupled to power supply conductors 64 and 58, respectively, and the common drains of transistors 74 and 76 are coupled to the gate of transistor 66 and to the gate of transistor 78. The source of transistor 78 is coupled to power supply conductor 64 while the drain of the same is coupled to node 62. Capacitor 82 is coupled between node 62 and power supply conductor 58 and typically made a large value such as 10 picofarads, or more, for by-pass filtering node 62 and aiding in the start-up process by supplying current through transistors 48 and 50. Alternately, capacitor 82 may be coupled between node 62 and power supply conductor 64.

The output waveform taken at terminal 46, or at terminal 44 as shown in FIG. 4, is mono-frequency sine wave with a peak-to-peak value of approximately one volt. To achieve a useful amplitude it is necessary to buffer and level-shift the output waveform of amplifier 52 through the inverter circuits formed by transistors 86–88, 90–92, 96–98 and 104–106. The gates of transistors 86 and 88 are coupled to terminal 44, although they could just as readily been coupled to terminal 46. The drains of transistors 86 and 88 are coupled together to the gates of transistors 90 and 92, while the common drains of the latter are coupled to the gates of transistors 96 and 98. The sources of transistors 86 and 90 are coupled to node 62, while the sources of transistors 88 and 92 are coupled to power supply conductor 58. The source of transistor 96 is coupled through resistor 100 to power supply conductor 64, and the source of transistor 98 is coupled to power supply conductor 58. The common drains of transistors 96 and 98 are coupled to the gates of transistors 104 and 106. The source of transistor 104 is coupled to power supply conductor 64 and the source of transistor 106 is coupled to power supply conductor 58. Transistors 48, 74, 78, 86, 90, 96 and 104 each include a connection between the source and body thereof which minimizes the body effect by reducing the switching threshold. The common drains of transistors 104 and 106 provide the buffered and level-shifted output signal at terminal 108 as a square waveform. Yet, the square output waveform switching between $V_{DD}$ and ground potential does not effect the resonant vibration of crystal 42 because the signal fed back through crystal 42 is still a sine wave. Thus, the sinusoidal waveform at terminal 44 is applied through inverters 86–88 and 90–92 for buffering the signal and sharpening the edges although still operating referenced to $V_{DD'}$. The output waveform of inverter 90–92 is level-shifted up toward $V_{DD}$ through a level translating resistor 100 and inverter 96–98. The final output signal provided at terminal 108 is square waveform with peak amplitude of $V_{DD}$.

Oscillator circuit 40 is enabled by a logic zero signal at input 70 which is inverted through transistors 74 and 76, turning on feedback transistors 66 and 68 and disabling transistor 78. In its alternate disable mode, a logic one at input 70 disables oscillator circuit 40 for testing purposes by turning off transistors 66 and 68 and breaking the feedback path between the input and output of amplifier 52. The logic zero at the drains of transistors 74–76 turns on transistor 78 shortcircuiting resistor 60 and bringing node 62 to $V_{DD}$.

Resistor 60 is made a large value, say six mega-ohms, for developing a small potential $V_{DD'}$, say one volt, at node 62 as compared to five volts for $V_{DD}$. The value of $V_{DD'}$ should be set to the sum of the upper switching threshold ($V_{TN}$) plus the lower switching threshold ($V_{TP}$) of transistors 48 and 50, respectively, $V_{DD'} = V_{TN} + V_{TP}$. Without crystal 42, amplifier 52 self-biases such that transistors 48 and 50 are conducting with a DC bias point of $V_{DD'}/2$. When crystal 42 is connected to terminals 44 and 46, the output signal of amplifier 52 becomes sinusoidal about the DC bias point operating at the inherent resonant frequency of crystal 42. Thus, with the source of transistor 50 directly connected to ground potential, the output signal of amplifier 52 oscillates between $V_{DD'}$ and ground potential with minimal movement in the input voltage, see FIG. 5. The narrow linear range of amplifier 52 keeps the simultaneous conduction of transistors 48 and 50 to a minimum, virtually zero, and reduces the average operating current to the order of hundreds of nanoamps. A conventional alkaline battery can maintain crystal oscillator 40 for several years with such a low operating current. Moreover, as the load at the output of amplifier 52 increases, more current is drawn through resistor 60 thereby reducing $V_{DD'}$ and increasing the gain of amplifier 52. Alternately, reducing the load at the output of amplifier 52 draws less current through resistor 60, increasing $V_{DD'}$ and decreasing the gain of amplifier 52. Thus, resistor 60 provides automatic gain control for oscillator circuit 40 by maintaining the potential at node 62 substantially equal to the sum of the switching thresholds of transistors 48 and 50, while allowing its operating current to vary linearly with changes in supply voltage $V_{DD}$.

Another advantage of reducing the operating potential of amplifier circuit 52 is the mono-frequency sinusoidal waveform produced at terminals 44 and 46 cycling at the resonant frequency of crystal 42 about the DC bias point. The single frequency matches the inherent vibrating resonance of crystal 42 thereby avoiding the energy loss from the multiple harmonics of the square output waveform used in the prior art. This mode of operation is a distinct improvement over prior art FIG. 1 wherein harmonics of fundamental frequency are no longer beating crystal 42 in a counterproductive manner.

Hence, what has been provided is a novel crystal oscillator including an amplifier operating with an automatic gain control circuit for reducing the power supply potential to a level substantially equal to the sum of the thresholds of the switching transistors which minimizes simultaneous conduction of the switching transistors thereby reducing the average operating current. The low level output signal of the amplifier becomes sinusoidal about a DC bias point operating at the resonant frequency of the crystal which eliminates undesirable harmonics interfering with the crystal's natural vibration.

We claim:

1. An oscillator circuit for providing an output signal, comprising:
   a crystal having first and second terminals;
   an amplifier circuit having an output coupled to said first terminal of said crystal and having an input coupled to said second terminal of said crystal for providing the output signal of the oscillator circuit, said amplifier circuit including,
   (a) a first transistor having a gate a drain and a source, said gate being coupled to said input of said amplifier circuit, said drain being coupled to said output of said amplifier circuit, said source being directly connected to a first source of operating potential, and
   (b) a second transistor having a gate, a drain and a source, said gate being coupled to said output of said amplifier circuit, said drain being coupled to said output of said amplifier circuit;
   circuit means coupled between said source of said second transistor at a first node and a second source of operating potential for controlling the operating potential of said amplifier circuit, said circuit means including a resistor coupled between said first node and said second source of operating potential;
   feedback means coupled between said input and output of said amplifier circuit for biasing said amplifier circuit; and
   a first capacitor coupled between said first node and either said first source of operating potential or said second source of operating potential.

2. The oscillator circuit of claim 1 wherein the output signal of the oscillator circuit may be taken at said output of said amplifier circuit.

3. The oscillator circuit of claim 2 further comprising:
   a second capacitor having a first terminal coupled to said input of said amplifier circuit and a second terminal coupled to said first source of operating potential; and
   a third capacitor having a first terminal coupled to said output of said amplifier circuit and a second terminal coupled to said first source of operating potential.

4. The oscillator circuit of claim 3 further comprising first means coupled to said feedback means for disabling the oscillator circuit; and
   second means coupled to said amplifier circuit for buffering and level-shifting the output signal of the oscillator circuit.

5. The oscillator circuit of claim 4 wherein said feedback means includes:
   a third transistor having a gate, a drain and a source, said drain being coupled to said output of said amplifier circuit, said source being coupled to said input of said amplifier circuit, said gate being coupled to said first means; and
   a fourth transistor having a gate, a drain and a source, said source being coupled to said output of said amplifier circuit, said drain being coupled to said input of said amplifier circuit, said gate being coupled for receiving an enable signal.

6. The oscillator circuit of claim 5 wherein said first means includes:
   a fifth transistor having a gate, a drain and a source, said source being coupled to said second source of operating potential, said drain being coupled to said gate of said third transistor;
   a sixth transistor having a gate, a drain and a source, said gates of said fifth and sixth transistors being coupled together for receiving said enable signal, said source being coupled to said first source of operating potential, said drain being coupled to said drain of said fifth transistor; and
   a seventh transistor having a gate, a drain and a source, said gate being coupled to said drains of said fifth and sixth transistors, said source being coupled to said second source of operating potential, said drain being coupled to said first node.

7. An oscillator circuit for providing an output signal, comprising:
   a crystal having first and second terminals;
   an amplifier circuit coupled for receiving first and second sources of operating potential and having an output coupled to said first terminal of said crystal and an input coupled to said second terminal of said crystal for providing the output signal of the oscillator circuit, said amplifier circuit including,
   (a) a first transistor having a gate, a drain and a source, said gate being coupled to said input of said amplifier circuit, said drain being coupled to said output of said amplifier circuit, said source being directly connected to said second source of operating potential, and
   (b) a second transistor having a gate, a drain and a source, said gate being coupled to said input of said amplifier circuit, being drain being coupled to said output of said amplifier circuit;

feedback means coupled between said input and output of said amplifier circuit for biasing said amplifier circuit;

first means coupled between said first source of operating potential and said amplifier circuit for reducing the average operating current thereof by controlling the leel of said first source of operating potential applied to said amplifier circuit to a value substantially equal to the sum of an upper threshold and a lower threshold of said amplifier circuit, said first means including a resistor coupled between said source of said second transistor at a first node and said first source of operating potential; and a first capacitor coupled between said first node and either said first source of operating potential or said second source of operating potential.

8. The oscillator circuit of claim 7 further comprising:

a second capacitor having a first terminal coupled to said input of said amplifier circuit and a second terminal coupled to said second source of operating potential; and a third capacitor having a first terminal coupled to said output of said amplifier circuit and a second terminal coupled to said second source of operating potential.

9. The oscillator circuit of claim 8 further comprising:

second means coupled to said feedback means for disabling the oscillator circuit; and third means coupled to said amplifier circuit for buffering and level-shifting the output signal of the oscillator circuit.

10. The oscillator circuit of claim 9 wherein said feedback means includes:

a third transistor having a gate, a drain and a source, said drain being coupled to said output of said amplifier circuit, said source being coupled to said input of said amplifier circuit, said gate being coupled to said first means; and a fourth transistor having a gate, a drain and a source, said source being coupled to said output of said amplifier circuit, said drain being coupled to said input of said amplifier circuit, said gate being coupled for receiving an enable signal.

* * * * *

UNITED STATES PATENT AND TRADEMARK OFFICE
CERTIFICATE OF CORRECTION

PATENT NO. : 5,113,156

DATED : May 12, 1992

INVENTOR(S) : John Mahabadi and Kenneth Burch

It is certified that error appears in the above-identified patent and that said Letters Patent is hereby corrected as shown below:

In column 5, line 55, claim 1, please delete the word "output" and insert the word --input--.

In column 6, line 16, claim 4, please insert --:-- after the word "comprising".

In column 7, line 1, claim 7, please delete the word "being" and replace it with the word --said--.

In column 7, line 9, claim 7, please delete "leel" and replace it with the word --level--.

Signed and Sealed this

Fifth Day of October, 1993

*Attest:*

BRUCE LEHMAN

*Attesting Officer*  Commissioner of Patents and Trademarks